(12) United States Patent
Schunk et al.

(10) Patent No.: US 7,073,957 B2
(45) Date of Patent: Jul. 11, 2006

(54) OPTOELECTRONIC TRANSMITTING AND/OR RECEIVING MODULE, CIRCUIT CARRIER, MODULE HOUSING, AND OPTICAL PLUG

(75) Inventors: Nikolaus Schunk, Maxhütte-Haidhof (DE); Gottfried Beer, Nittendorf (DE); Josef Wittl, Parsberg (DE)

(73) Assignee: Infineon Technologies AG, Munich (DE)

( * ) Notice: Subject to any disclaimer, the term of this patent is extended or adjusted under 35 U.S.C. 154(b) by 60 days.

(21) Appl. No.: 10/639,397

(22) Filed: Aug. 12, 2003

(65) Prior Publication Data

US 2004/0156639 A1    Aug. 12, 2004

(30) Foreign Application Priority Data

Aug. 12, 2002  (DE) ................. 102 37 403

(51) Int. Cl.
*G02B 6/42*   (2006.01)
*H04B 10/02*  (2006.01)

(52) U.S. Cl. .................... 385/92; 385/53; 385/88; 385/94; 398/140

(58) Field of Classification Search ............ 385/88, 385/89, 93, 92, 53, 94; 398/140
See application file for complete search history.

(56) References Cited

U.S. PATENT DOCUMENTS

| | | | | |
|---|---|---|---|---|
| 6,234,686 B1 * | 5/2001 | Tonai et al. | .................. | 385/88 |
| 6,302,596 B1 * | 10/2001 | Cohen et al. | .................. | 385/93 |
| 6,309,566 B1 | 10/2001 | Müller et al. | | |
| 6,422,766 B1 * | 7/2002 | Althaus et al. | ............... | 385/94 |
| 6,550,983 B1 * | 4/2003 | Gilliland et al. | ............. | 385/93 |
| 6,709,166 B1 * | 3/2004 | Miyachi et al. | ............... | 385/56 |
| 2003/0091304 A1 * | 5/2003 | Tonai et al. | .................. | 385/93 |

FOREIGN PATENT DOCUMENTS

| | | |
|---|---|---|
| DE | 199 09 242 A1 | 8/2000 |
| EP | 0 921 426 A1 | 6/1999 |

OTHER PUBLICATIONS

Kenneth O. Hill et al.: "Fiber Bragg Grating Technology Fundamentals and Overview", Journal of Lightwave Technology, vol. 15, No. 8, Aug. 1997, pp. 1263-1276.

R. Paul: "Optoelektronische Halbleiterbauelemente", Teubner Studienskripten, Angewandte Physik/Elektrotechnik, ISBN 3-519, pp. 203 and 204 ["Optoelectronic Semiconductor Elements", Teubner Study Scripts, Applied Physics/Electrical Engineering], no date.

J. M. Hammer et al.: "Single-wavelength operation of the hybrid-external Bragg-reflector-waveguide laser under dynamic conditions", *Appl. Phys. Lett.*, vol. 47, No. 3, Aug. 1, 1985, pp. 183-185.

* cited by examiner

*Primary Examiner*—John D. Lee
*Assistant Examiner*—James D. Stein
(74) *Attorney, Agent, or Firm*—Laurence A. Greenberg; Werner H. Stemer; Ralph E. Locher

(57) ABSTRACT

An optoelectronic transmitting and/or receiving module and an optical plug include a circuit carrier disposed at least partially in an alignment parallel to the optical axis of the module in a module housing. The circuit carrier forms a tongue-shaped region that protrudes into the continuation. A transmitting device and/or a receiving device is disposed in the continuation, where they are connected to the circuit carrier. The associated axial offsetting of the transmitting device and/or receiving device in the direction of an optical plug to be coupled on permits the provision of plug-in connections with improved protection of the devices and the fiber ends.

64 Claims, 14 Drawing Sheets

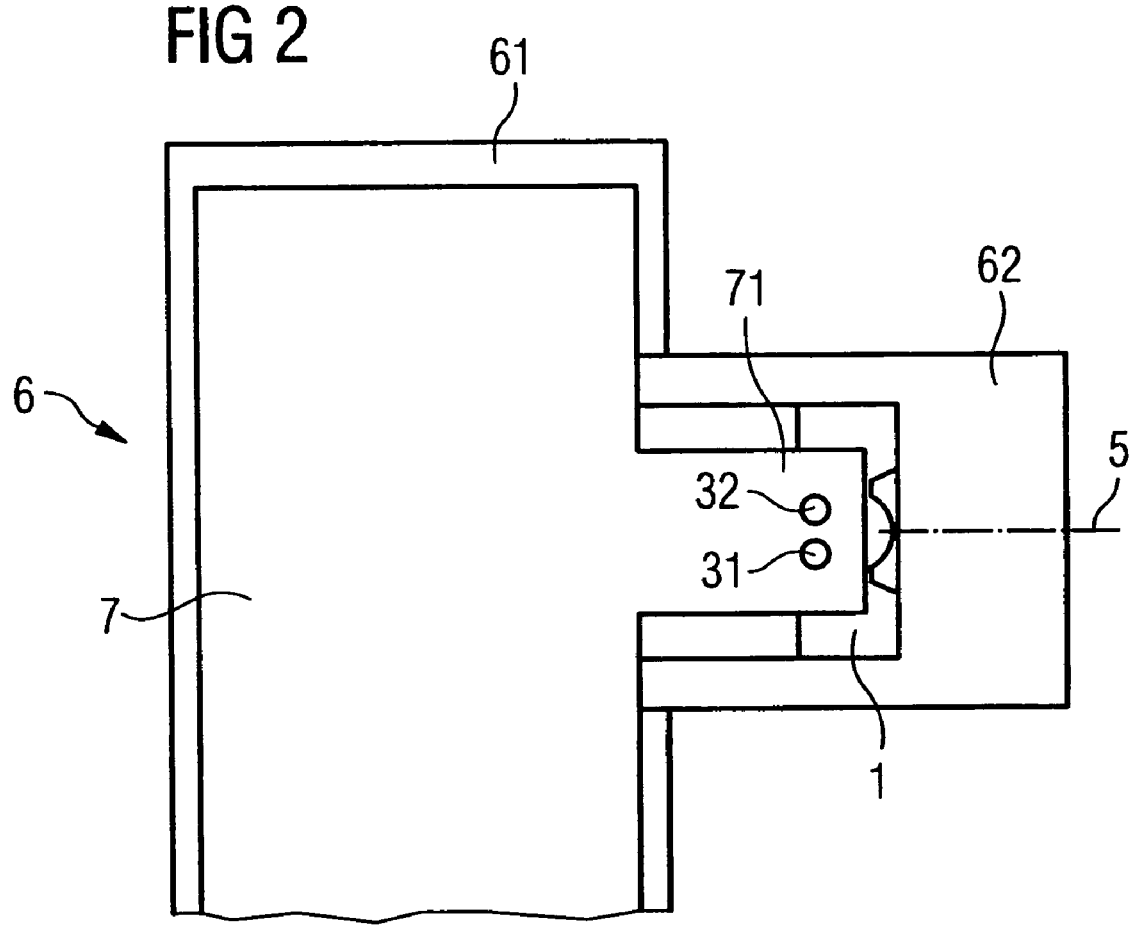

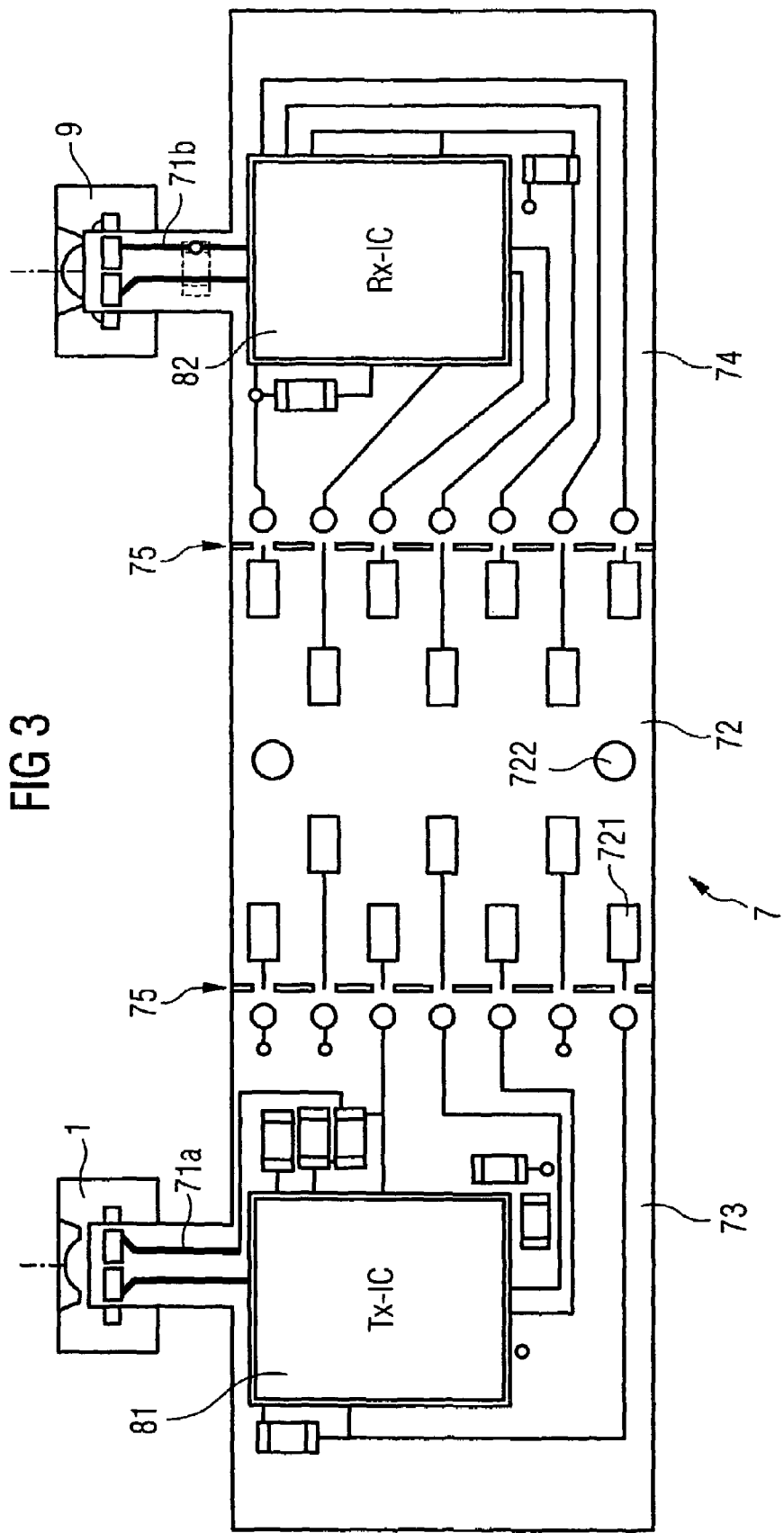

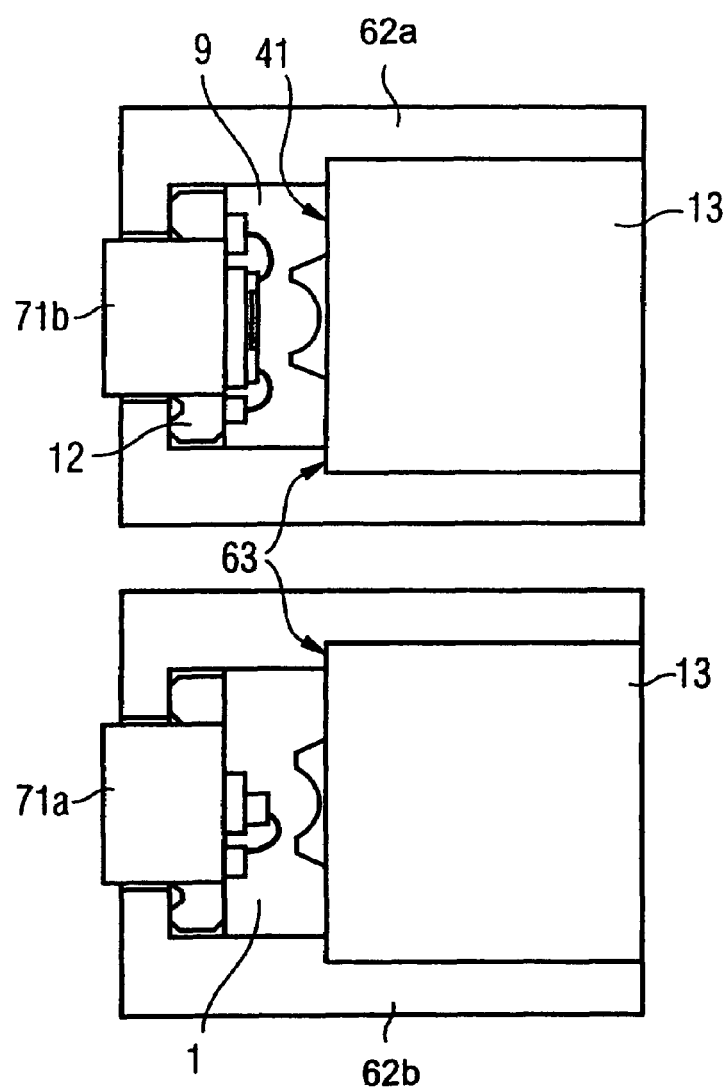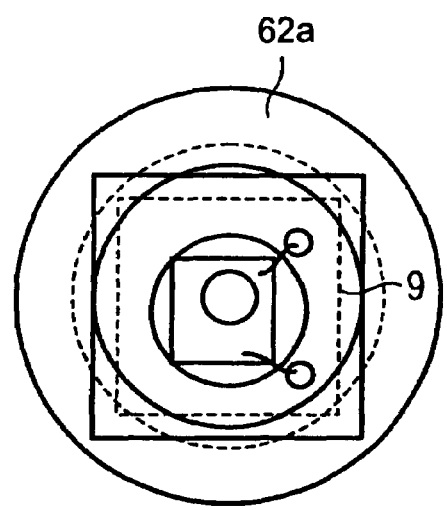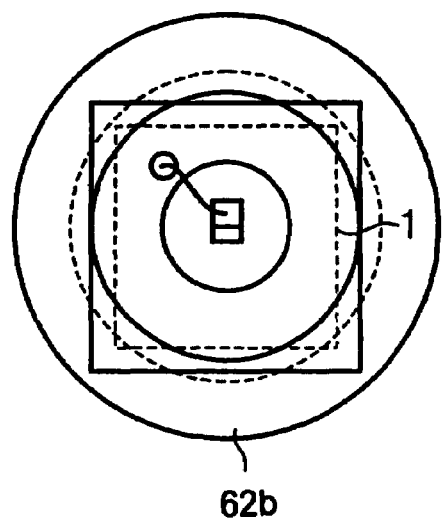

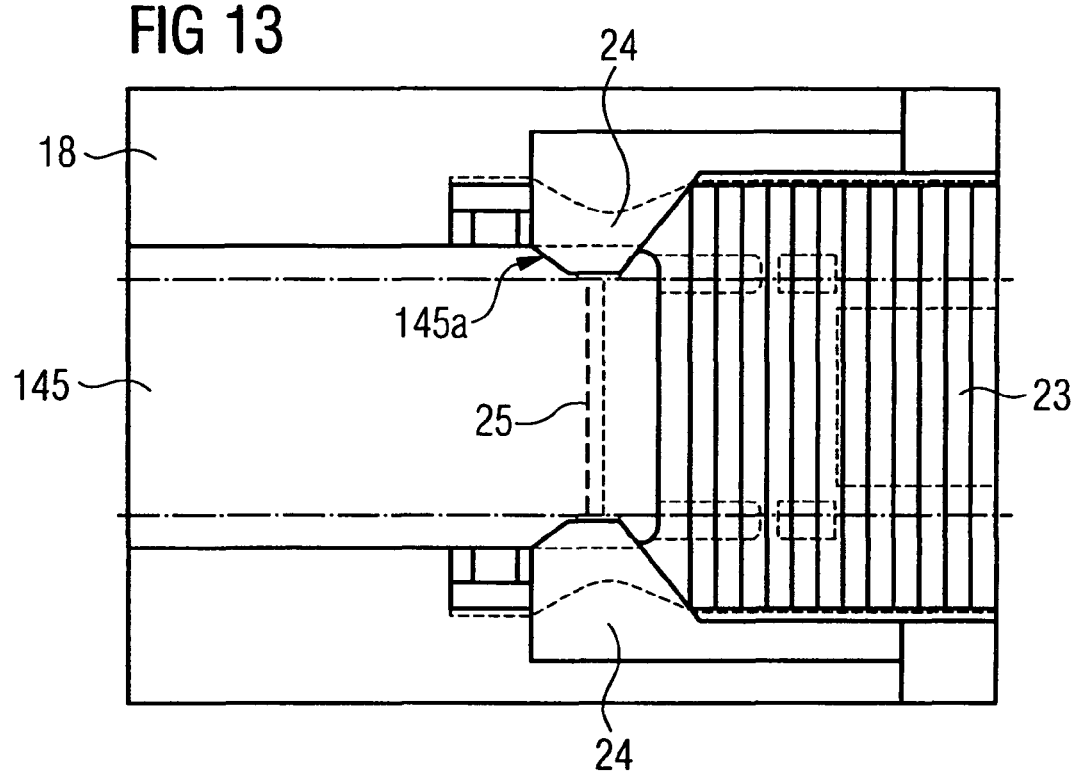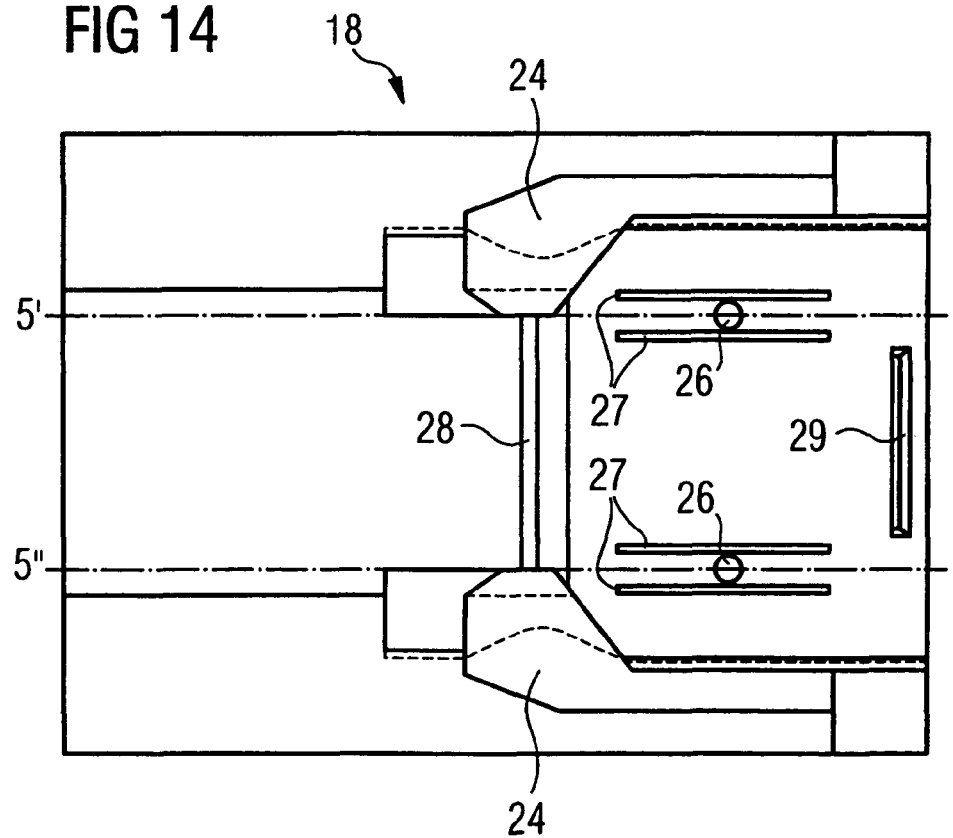

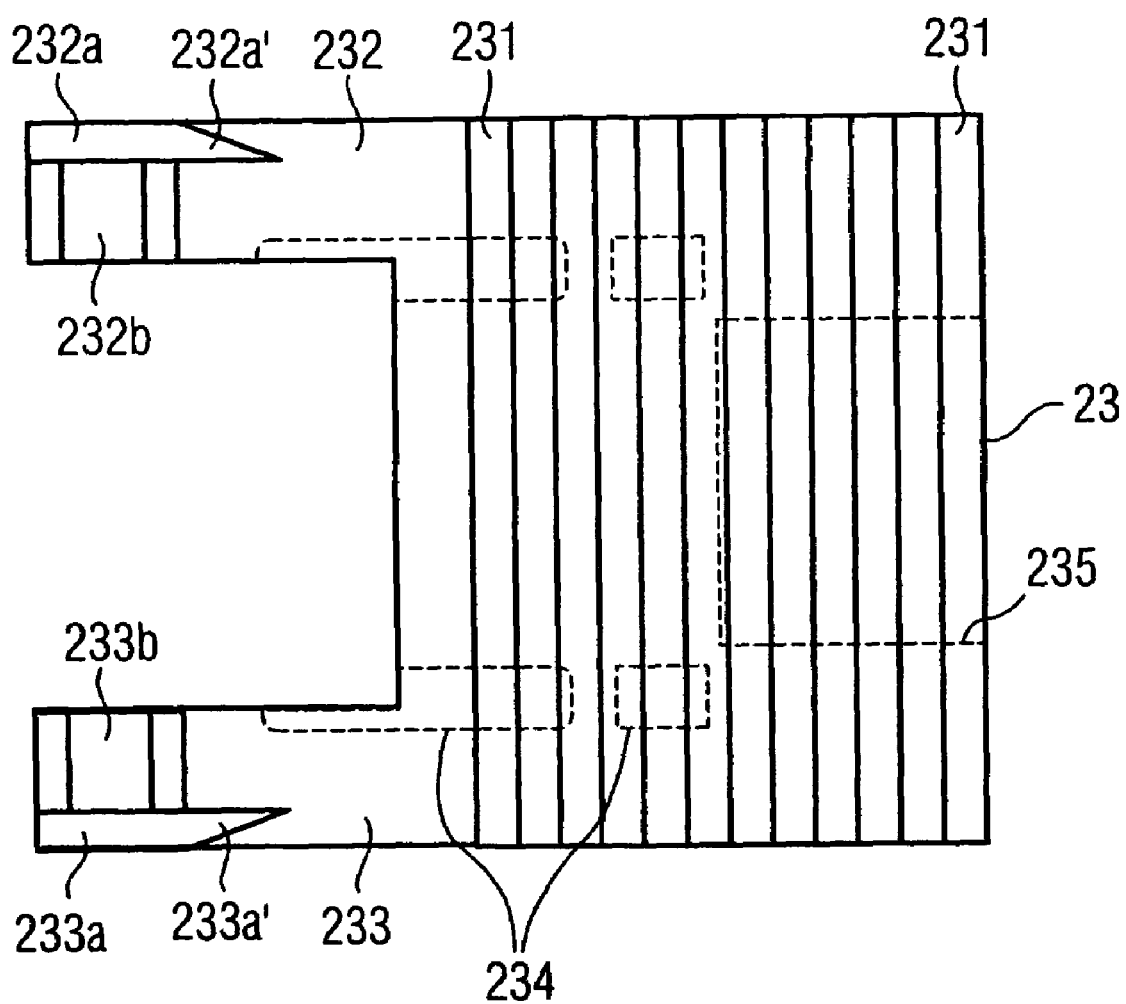

OPTOELECTRONIC TRANSMITTING AND/OR RECEIVING MODULE, CIRCUIT CARRIER, MODULE HOUSING, AND OPTICAL PLUG

BACKGROUND OF THE INVENTION

Field of the Invention

The invention relates to an optoelectronic transmitting and/or receiving module. In addition, the invention relates to a circuit carrier, a module housing, and an optical plug, which is preferably used in conjunction with or as part of an optoelectronic module. A preferred application area of the invention is that of low-cost optoelectronic modules that are coupled to POF (Plastic Optical Fiber) optical waveguides. Within this preferred application area, the invention is suitable in particular for use in multimedia networks in the in-house sector and in the automotive sector.

German Published, Non-Prosecuted Patent Application No. DE 199 09 242 A1, which corresponds to U.S. Pat. No. 6,309,566, discloses an optoelectronic module in which a support with an optoelectronic transducer is positioned in a module housing and is encapsulated in a translucent, moldable material. Coupling in or out of light takes place via an optical fiber that is coupled to a stub of the module housing. On the support, there is also the driver device or receiving device for the optoelectronic transducer.

It is desirable to construct a plug-in connection between an optical plug and a transceiver in such a way that on the one hand the greatest possible degree of electromagnetic shielding is provided and on the other hand the fiber end face is not soiled and is reliably protected even in the event of inadvertently incorrect plugging, or what is known as "blind" plugging. Known for this purpose is the so-called "kojiri" criterion, on the basis of which the fiber is protected in the manner of a "sword sheath" (Japanese: kojiri) in such a way that the fiber can only emerge from the protective surrounding once the plug has been inserted into guiding grooves of the assigned plug housing and positions itself in front of the corresponding transducer without soiling. This has until now been realized by using a movable kojiri guard, which however entails increased expenditure.

SUMMARY OF THE INVENTION

It is accordingly an object of the invention to provide an optoelectronic transmitting and/or receiving module, a circuit carrier, a module housing, and an optical plug that overcome the hereinafore-mentioned disadvantages of the heretofore-known devices of this general type and that make it possible to provide a high degree of electromagnetic shielding and at the same time to protect the optical fiber of a plug to be coupled to the optoelectronic module reliably from soiling and damage.

With the foregoing and other objects in view, there is provided, in accordance with the invention, an optoelectronic transmitting and/or receiving module. The optoelectronic module includes a transmitting and/or receiving device, an electrical wiring device, a circuit carrier, and a module housing. The transmitting and/or receiving device has an optical axis. The electrical wiring device connects to the transmitting device. The circuit carrier connects to the transmitting device, supports the transmitting device and the electrical wiring device, and forms a tongue-shaped region. The module housing holds the circuit carrier at least partially parallel to the optical axis and has a continuation extending in a direction of the optical axis of the transmitting device. The continuation is configured to couple to an optical plug and has the tongue-shaped region and the transmitting device extending therein.

With the objects of the invention in view, there is also provided an optical plug for an optoelectronic module. The optical plug includes a plug housing, an optical fiber, and a latching device. The plug housing has an extreme end and a fixed peripheral guard wall formed at the extreme end. The optical fiber has an end face. The end face projects within the extreme end of the plug housing and is protected by the peripheral guard wall. The latching device connects the optical plug to a mating coupling part.

The invention is distinguished by the fact that a circuit carrier, which is disposed in a module housing and bears a transmitting device and/or a receiving device and assigned wiring devices, is disposed in an alignment parallel to the optical axis of the transmitting device or receiving device in the module housing. In this case, the circuit carrier forms a tongue-shaped region, which protrudes into a continuation of the module housing serving for the coupling on of an optical plug. The transmitting device and/or receiving device is disposed in the continuation, where it is connected to the circuit carrier, consequently is installed in the module housing such that it is offset in the axial direction.

The axial displacement of the transmitting device and/or receiving device into the coupling continuation of the module housing, and consequently in the direction of an optical plug to be coupled on, makes it possible to couple onto the optoelectronic module an optical plug that is provided with a fixed kojiri guard and for this purpose forms a fixed, peripheral guard wall that projects beyond the end face of the optical fiber in a protective manner. In the case of the configuration of the transceiver according to the invention, such a kojiri guard wall extends beyond the transmitting device or receiving device, in that it encloses the continuation of the module housing, with the result that a complete four-sided kojiri guard is achieved.

If the peripheral guard wall includes an electrically conductive material, the transmitting and/or receiving device is also additionally shielded electromagnetically by the projecting plug guard wall, so that interfering radiation emitted is reduced considerably.

The solution according to the invention is consequently based on the idea of disposing the transmitting or receiving device of an optoelectronic module in the continuation of the module housing serving for the coupling on of an optical plug. This is technically realized on the one hand by an alignment of the circuit carrier parallel to the optical axis of the module housing and on the other hand by a tongue-shaped region of the circuit carrier, which protrudes into the continuation, with the result that the transmitting device or receiving device in the continuation can be mounted on the circuit carrier.

In a preferred configuration of the invention, the continuation is cylindrically formed, although in principle other shapes such as a rectangular form are also conceivable.

The transmitting device and/or receiving device are preferably respectively disposed in a device housing, which preferably includes a transparent encapsulating material. In a first variant, the device is disposed on a leadframe that is cast into the device housing or transparent encapsulating material, the terminal contacts of the leadframe protruding laterally from the device housing. As an alternative, the device housing does not need a leadframe and the transmitting device and/or receiving device have electrical terminal contacts on the rear side of the device housing. In particular, a so-called TSLP (Thin Small Leadless Package) construction technology is preferably used for this purpose.

The circuit carrier may include a solid, non-flexible material, for example an FR-4 board. As an alternative, the circuit carrier is a flexible circuit carrier, for example a flex board. In the first case, the transmitting component preferably has a leadframe and is flattened on its contact side toward the circuit carrier, in order to permit fastening on the circuit carrier. The terminal contacts of the leadframe may in this case protrude straight out and penetrate the circuit carrier or be bent away laterally.

A flexible circuit carrier with a device housing with electrical terminal contacts disposed on the rear side is preferably used. The device housing in this case electrically bonds the circuit carrier with its contacts that are disposed on the rear side and are configured parallel to the optical axis. In the region in which the transmitting device or receiving device is disposed, the flexible circuit carrier is angled away by ninety (90) degrees. In the case of this variant, the device housing advantageously has the same shape as the continuation of the module housing. A lateral clearance on the device housing, as in the case of the configuration with a leadframe in conjunction with a solid board, is not required.

The module housing is preferably formed such that it is open on at least one side, this side being closed after mounting of the circuit carrier by at least one side part that covers over the circuit carrier. To improve the electromagnetic shielding, the module housing preferably has electrical shielding and, for this purpose, is formed in particular from an electrically conducting material, in particular an electrically conducting plastic. Furthermore, it is preferably provided that the interior of the module housing is filled with a likewise electrically conductive encapsulating material. In order to prevent electrical short-circuits, the circuit carrier is protected from the encapsulating material, at least in the region of the devices and the electrical bonding contacts, for instance by a covering.

The device housing is preferably formed such that it is circular or rectangular in section. A rectangular configuration is particularly preferred in the cases in which the device is produced together with the device housing on a wafer. The device housing is then prepared by sawing out with a wafer saw.

Preferably, both the continuation of the module housing and the device housing and/or the transmitting or receiving device have structures that permit self-adjusting mounting of the device in the continuation. This involves for example stop structures on the device housing.

In a further preferred configuration, it is envisaged to dispose in the continuation of the module housing an elastic deforming body. The elastic deforming body resilient mounts the device housing in the continuation. When there is pressure of an assigned optical fiber of an optical plug on the transmitting or receiving module, the latter can yield rearward, the elastic deforming body producing a restoring force, in order that a fixed contact is maintained (butt coupling) and consequently the device housing is positioned against a front stop after the plug is pulled out. In this way, it is possible to keep to a minimum the gap between the end face of an optical fiber and the device housing or light-guiding structures formed in the latter, such as a lens, in order to minimize coupling losses.

The module housing with the components explained is preferably disposed in a surrounding housing for the transceiver (often referred to as a header). Such a surrounding housing preferably has a first region, which receives the module housing, and a second, axially offset region, which provides a receiving opening for an optical waveguide to be coupled on of an optical plug. Preferably provided in this case in the second region of the surrounding housing is a snap mechanism that permits a latching connection of the surrounding housing to a plug to be coupled on. Furthermore, it is preferably provided that the first region and the second region of the surrounding housing are separated from each other by a dividing wall. The dividing wall has in this case an opening through which the continuation of the module housing protrudes into the second region and in a corresponding way can be coupled to an optical plug.

In a preferred configuration of the module housing, at least one fixing pin, which is mounted in the module housing in corresponding openings and passes through the module housing, is provided. This serves for exact positioning of the module housing in the surrounding housing and on an assigned main circuit board. The fixing pin is preferably formed in an electrically conducting, in particular metallic, manner, with the result that induced electromagnetic currents in the interior of the module housing can flow away via it.

The module according to the invention is preferably an optoelectronic transceiver with a transmitting device and a receiving device that are respectively disposed in continuations of the module housing that are spaced apart from each other. The circuit carrier is in this case preferably formed in a U-shaped manner and has three regions. A first bottom region is provided with terminal contacts for the electrical bonding of the circuit carrier with a main circuit board. A first side region is angled away by 90 degrees with respect to the bottom region and bears the transmitting device and the associated wiring device. A second region is likewise angled away by 90 degrees with respect to the bottom region and bears the receiving device and the associated wiring device.

The optical plug according to the invention is characterized by the features that a plug housing forms at the extreme end a fixed, peripheral guard wall which projects in a protective manner beyond the end face of the optical fiber. In this way, the end face of the optical fiber is reliably protected from damage and soiling even in the event of inadvertent incorrect plugging or so-called "blind" plugging, as occurs in particular in the automotive sector. When the optical plug is inserted into an electrooptical module according to claim 1, the projecting guard wall couples with the continuation of the module housing, the projecting guard wall extending over the transmitting device or receiving device and accordingly providing in the case of a metallic configuration an additional electromagnetic shielding, in any event an additional mechanical guard.

Latching devices of the plug preferably have a latching edge for the latching engagement of a latching element of a mating coupling part, movable clamping elements for the securing of a latching engagement and a movable plug release, the movable plug release allowing the movable clamping elements to be actuated. The plug release, the clamping elements and the latching element of the mating coupling part in this case preferably interact in such a way that, when the plug release is actuated, first of all the clamping elements are pivoted away laterally from the latching element and subsequently the latching element is raised above the locking edge.

It may also be provided that the plug release on the one hand has beveled lateral edges, which interact with edges formed on the underside of the clamping lobes when the plug release is actuated, and on the other hand has trapezoidal elevations, that have the effect of raising a latching element of a mating coupling part which is to be unlatched.

Other features that are considered as characteristic for the invention are set forth in the appended claims.

Although the invention is illustrated and described herein as embodied in an optoelectronic transmitting and/or receiving module, a circuit carrier, a module housing, and an optical plug, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 2 is a side view showing a module housing with a cylindrical continuation, the module housing being represented in a laterally open form and containing a circuit carrier and the transmitting device according to FIG. 1;

FIG. 3 is a circuit diagram showing an opened representation of a circuit carrier with two side regions, which respectively form a tongue-shaped region connected to a transmitting device or a receiving device;

FIG. 5A is a front view showing the transmitting device of FIG. 4B in a cylindrical continuation of a module housing;

FIG. 5B is a lateral sectional view showing the receiving device of FIG. 5A;

FIG. 5C is a front view showing the transmitting device of FIG. 4A in a cylindrical continuation of a module housing;

FIG. 5D is a lateral sectional view showing the transmitting device of FIG. 5C;

FIG. 13 is a sectional view of the plug of FIG. 11 with a latching pawl of the surrounding housing engaging the plug;

FIG. 14 is a sectional view showing the plug of FIGS. 11 to 13 without the plug release being represented; and FIG. 15 is a sectional view showing a representation of the plug release of the plug of FIGS. 11 to 14.

DESCRIPTION OF THE PREFERRED EMBODIMENTS

Figure 1A:
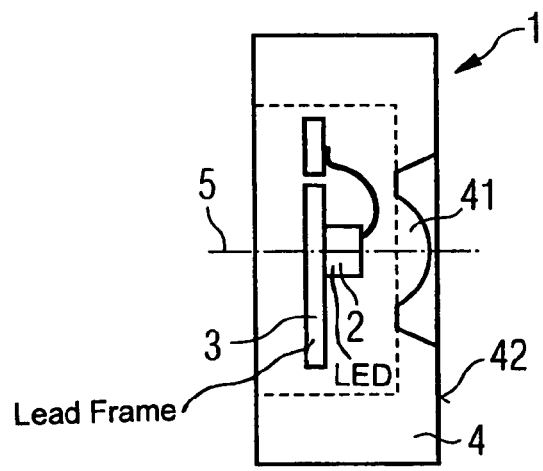
FIG. 1A is a lateral sectional view showing a first embodiment of a transmitting device disposed on a leadframe and in a transparent casting compound.

Referring now to the figures of the drawings in detail and first, particularly to FIG. 1 thereof, there is shown an I/O transducer device 1, which has a light-emitting transmitting device 2 disposed on a leadframe 3. The transmitting device 2 is in particular a semiconductor laser or a light-emitting diode. The transmitting device is electrically bonded in the customary way via the leadframe. The transmitting device 1 and the leadframe 3 are disposed in a housing 4, which is formed from an optically transparent encapsulating material.

In this case, a coupling lens 41 is disposed in the encapsulating material in the optical path of rays of the transmitting device 2. Furthermore, the extreme end 42, neighboring the coupling lens 41, of the device housing 4 forms a fiber stop face for the fiber end face of an optical fiber to be coupled.

Figure 1B:
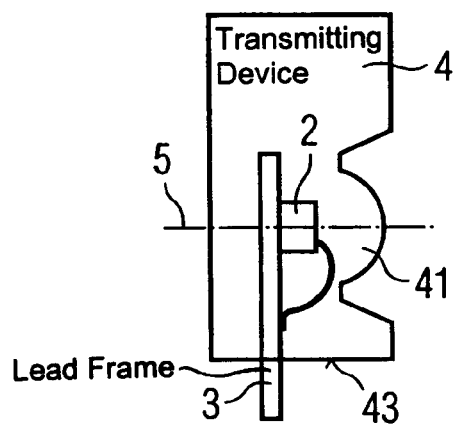
FIG. 1B is a plan view of the transmitting device shown in FIG. 1A.
Figure 1C:
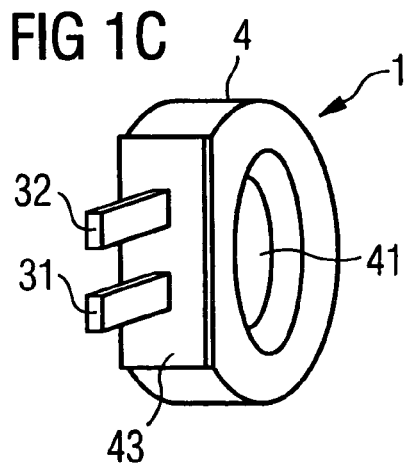
FIG. 1C is a perspective view of the transmitting device shown in FIG. 1A.

FIG. 1C shows two terminal contacts 31, 32 of the leadframe 3. The optical axis of the transducer device is identified by reference numeral 5. It is pointed out that the vertex of the coupling lens 41 is slightly offset axially with respect to the fiber stop face 42.

As represented in FIGS. 1B and 1C, the device housing 4 is not formed in a completely circular manner but is flattened to its contact side 43 toward a circuit carrier. This permits the configuration in a cylindrical continuation, as represented in the following FIG. 2.

A receiving element, which is formed in particular as a monitor diode, may also be formed in a corresponding way.

Also represented in FIG. 2, in a side view, is a module housing 6, which is also referred to as a CAI (Cavity as Interface) housing, which forms a main housing region 61 and a cylindrical continuation (which may also be referred to as an extended tube) 62. In the module housing, there is a circuit carrier 7, which has a tongue-shaped region 71, which protrudes into the cylindrical continuation 62 of the module housing 6. The tongue-shaped region 71 serves for the fastening of the transducer device 1 according to FIG. 1. The lateral representation of FIG. 2 reveals the terminal contacts 31, 32, by which the transducer module 2 is electrically connected to the circuit carrier 7 (i.e. a circuit board). Due to the described flattening of the transducer module 1, it is possible in spite of the configuration of the tongue-shaped region 71 of the printed circuit board 7 for the transducer module to be disposed in the continuation 62 in such a way that its optical axis 5 lies on the optical axis of the cylindrical continuation.

Disposed on the circuit board 7, in the main region 61 of the module housing 6, are wiring devices, which represent in particular a driving circuit for the transmitting device or a receiving circuit for a receiving element. In addition, conductor tracks are formed in the customary way on the printed circuit board.

FIG. 3 shows a circuit carrier, which is used in an optoelectronic transceiver in which the module housing 6 has both a cylindrical continuation for a transmitting device and a cylindrical continuation for a receiving device.

The circuit carrier 7 is disposed in a U-shaped manner and has a bottom part 72 and two side parts 73, 74. In the representation of FIG. 3, the three parts 72, 73, 74 are spread out flat. The bending locations 75 between the bottom part and the respective side parts are provided with a kind of perforation in order to improve the bendability. The bottom part 72 has electrical contacts 721 for the electrical bonding of a main circuit board, onto which the bottom part 72 is mounted. The two side parts 73, 74 respectively have a wiring device 81 for a transmitting element of an I/O transducer device 1 and a wiring device 82 for a transmitting element of an O/I transducer device 9.

The two transducer modules 1, 9 are respectively disposed on the tongue-shaped regions 71a, 71b of the respective side part 73, 74 protruding into a cylindrical continuation.

Adjustment holes 722 made in the bottom part serve for the assembly of the transceiver and the fixing in a surrounding housing by using pins and also for the passive alignment with respect to the main circuit board, as still to be explained.

It is pointed out that the signaling and electrical bonding represented in FIG. 3 are to be understood as given only by way of example.

It is further pointed out that the bottom part is preferably formed as a flexible foil, while the side parts 72, 74 are formed as solid side boards, in particular FR4 side boards.

Figure 4A:
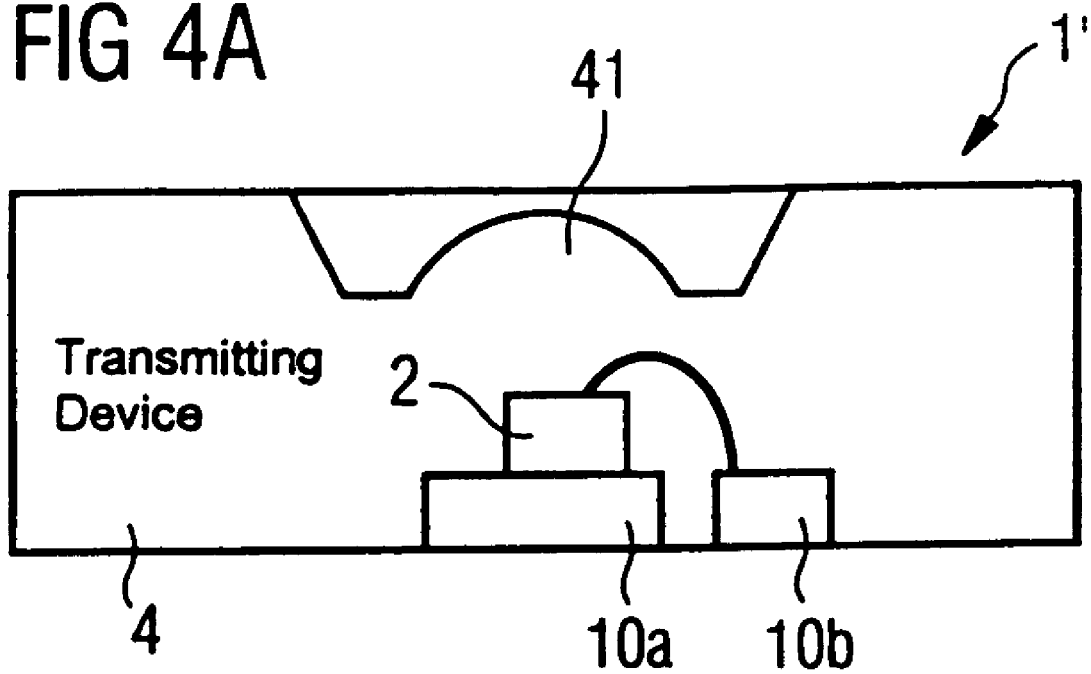
FIG. 4A is a partial schematic and partial diagrammatic front view of a second embodiment of a transmitting device, the transmitting device being formed using TSLP technology.

FIG. 4A shows an exemplary embodiment of an I/O transducer device 1' as an alternative to that of the representation of FIG. 1. The transducer device is produced here using TSLP (thin smaller leadless package) technology. A transmitting device 2 is in turn encapsulated in a device housing 4 that includes a transparent encapsulating material with an integrated lens 41. However, no leadframe is provided for the electrical bonding of the transmitting device 2, but instead two electrical terminals 10a, 10b, which are disposed on the rear side of the transducer device 1'.

The production of an I/O transducer using TSLP technology takes place in a way known per se by firstly a multiplicity of transducers being disposed on a conducting board, for example a copper plate, and bonded. The regions of the printed circuit board that are not required are then etched away, so that the contacts on the rear side are formed. Before the etching operation, encapsulation of the transducers in a transparent casting material is performed. At the end of the production process, there is individual separation.

Figure 4B:
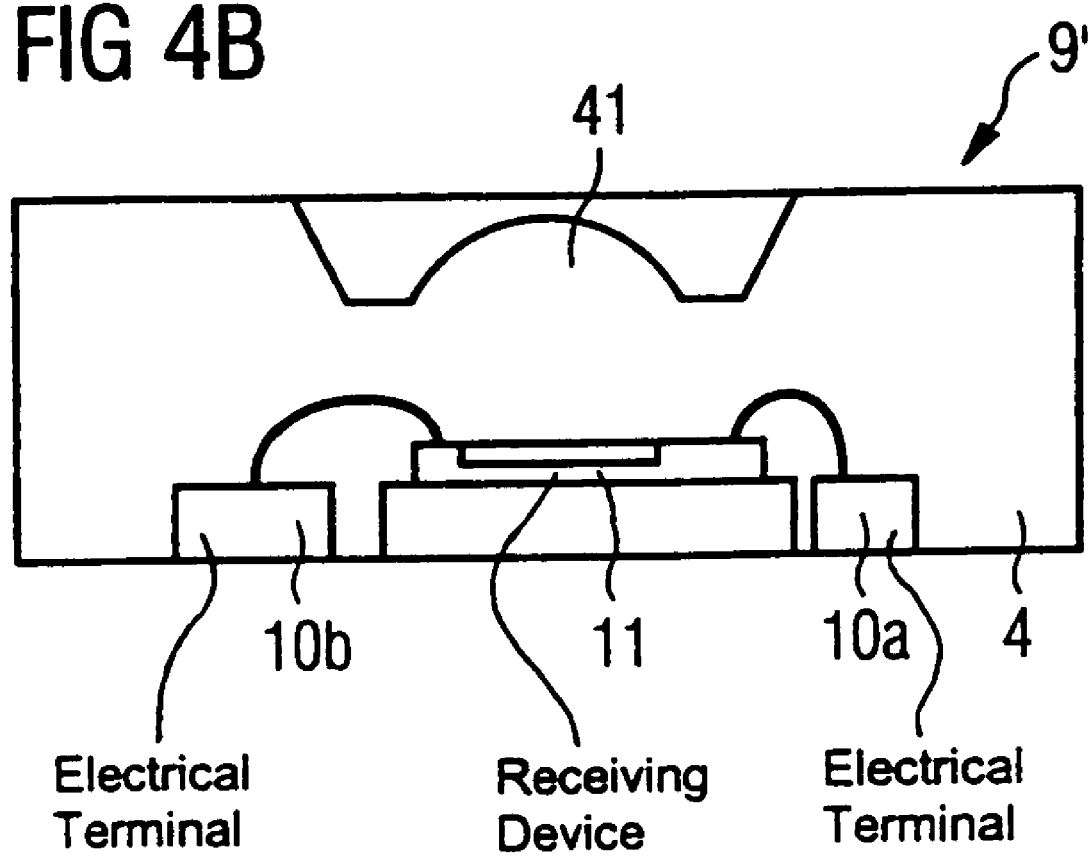
FIG. 4B is a partial schematic and partial diagrammatic front view of a receiving device using TSLP construction technology.

FIG. 4B shows a construction corresponding to FIG. 4A for an O/I transducer component 9'. A receiving device 11 is electrically bonded via electrical terminals 10a, 10b and is encapsulated in an encapsulating body 4 with an integrated, light-shaping element 41.

FIGS. 5A–5D shows the basic installation of a transducer device into the cylindrical continuation of a module housing, only the continuation 62 of the module housing being represented for the sake of better overall clarity. The representation shows, in parallel configuration, a first continuation 62a, in which a receiving transducer device is disposed, and a continuation 62b, in which a transmitting transducer device is disposed. The transducers are embodied in the TSLP type of construction according to FIG. 4.

It is pointed out here that the transducer devices are configured in a rectangular manner, as illustrated in the right-hand representation of FIGS. 5B and 5D, which show views in the direction of the optical axis. The transducer devices are in this case individually separated after production in a simple way by using a wafer saw. The edge length of the transducer devices is dimensioned such that the transducer device is in bearing contact at its corners in the cylindrically configured continuation or extended tube 62. This is irrespective of whether the transceiver is constructed for so-called SMI plugs (inner cylinder 25 mm) or for the automotive sector (inner cylinder 29 mm).

For the resilient mounting of the transducer device 1, 9, an elastic deforming body is disposed between the transducer device 1, 9 and a stop of the cylindrical continuation. A fiber ferrule to be coupled on is inserted into the receiving region 13 of the continuation 62 and comes up against the fiber stop face 41, described with respect to FIG. 1, and also a stop face 63 formed in the continuation 62. When there is pressure of the inserted fiber ferrule on the transducer device, the latter can yield rearward because of the elastic deforming body 12. At the same time, the elastic deforming body 12 produces a restoring force, in order that close contact is maintained (butt coupling). In this way, a high-quality coupling with low coupling losses is provided.

Figure 5E:
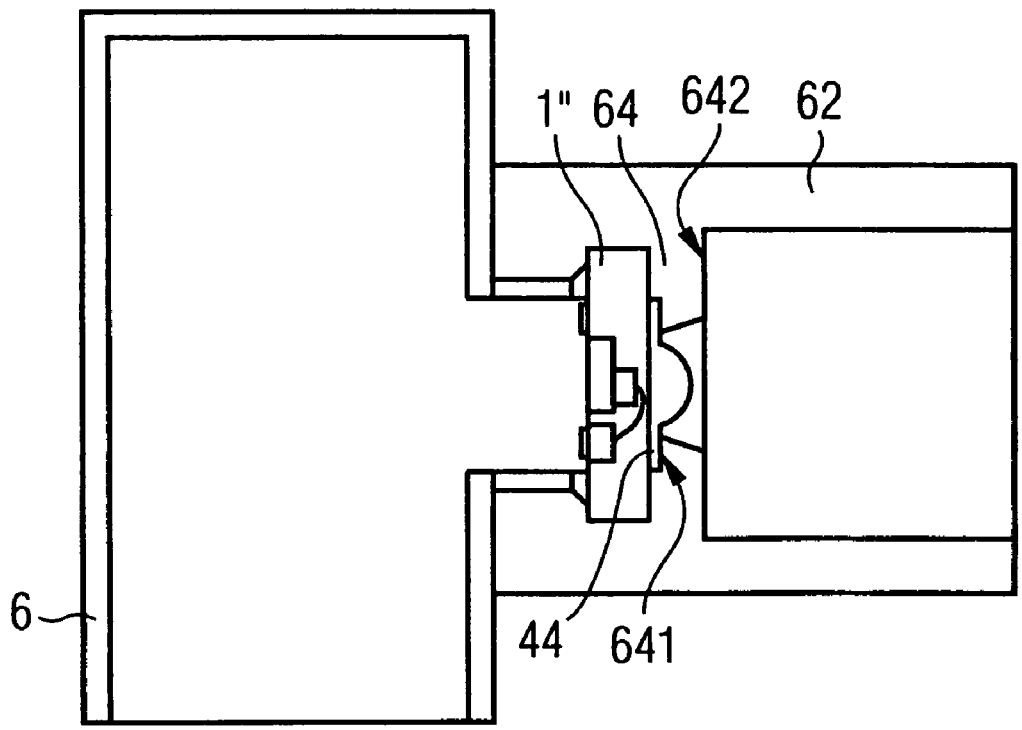
FIG. 5E is a sectional view showing a second embodiment of a transmitting or receiving device in a cylindrical continuation of a module housing.

FIG. 5E shows the installation of an alternatively configured transducer device into the cylindrical continuation 62 of a module housing 6. The module housing is represented in full in FIG. 5E.

Figure 5F:
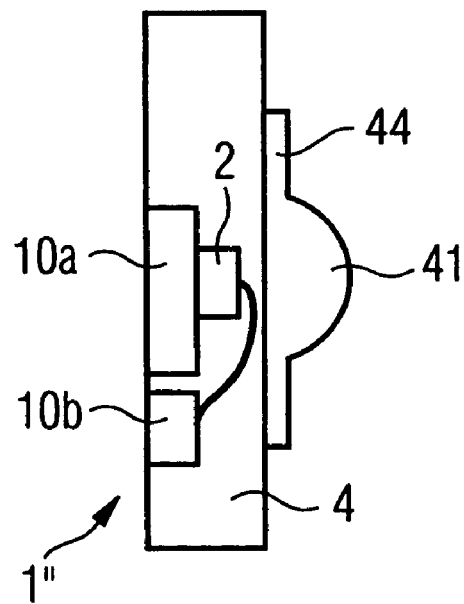
FIG. 5F is a lateral sectional view showing the transmitting or receiving device of the configuration of FIG. 5b.
Figure 5G:
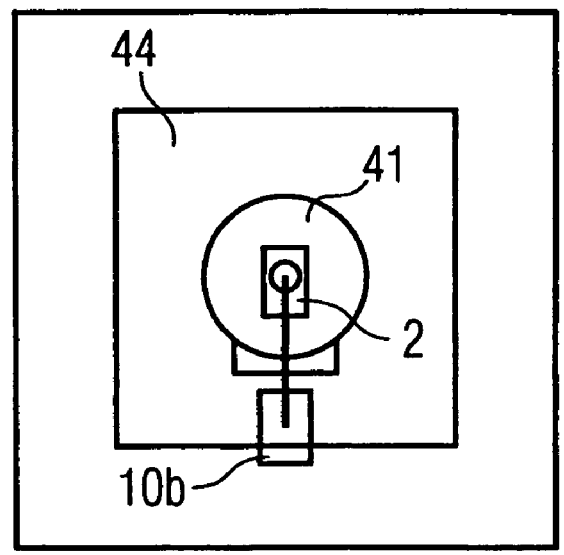
FIG. 5G is a front view showing the transmitting device of the configuration of FIG. 5E.

The alternatively configured module device is represented in FIGS. 5F and 5G. According to this, a transmitting component 2 (alternatively a receiving component) and electrical contacts 10a, 10b for the connection with a circuit board are in turn disposed in an encapsulating material 4. Additionally provided is a passive adjusting structure 44, which is aligned precisely with respect to the coupling lens 41 and the transmitting device 2 (or a receiving device) and serves for the exact fitting and automatic adjustment of the transducer device 1" into the continuation or extended tube 62 of the module housing. Consequently, FIG. 5E reveals that the passive adjusting structure comes into bearing contact with a corresponding clearance 641 of a central web 64 of the continuation 62. In this case, the central web 64 forms a fiber stop face 642. The central web 64 has an opening, which is formed symmetrically with respect to the optical axis and through which the coupling lens 41 protrudes. The lens vertex in this case remains back from the fiber stop face 642 by about 50 μm.

The passive adjusting structure 44 can be aligned very precisely with respect to the lens and the transducer component 2, since the structure is structured during the production process and for this purpose is, for example, integrated into a production mold.

Figure 6:
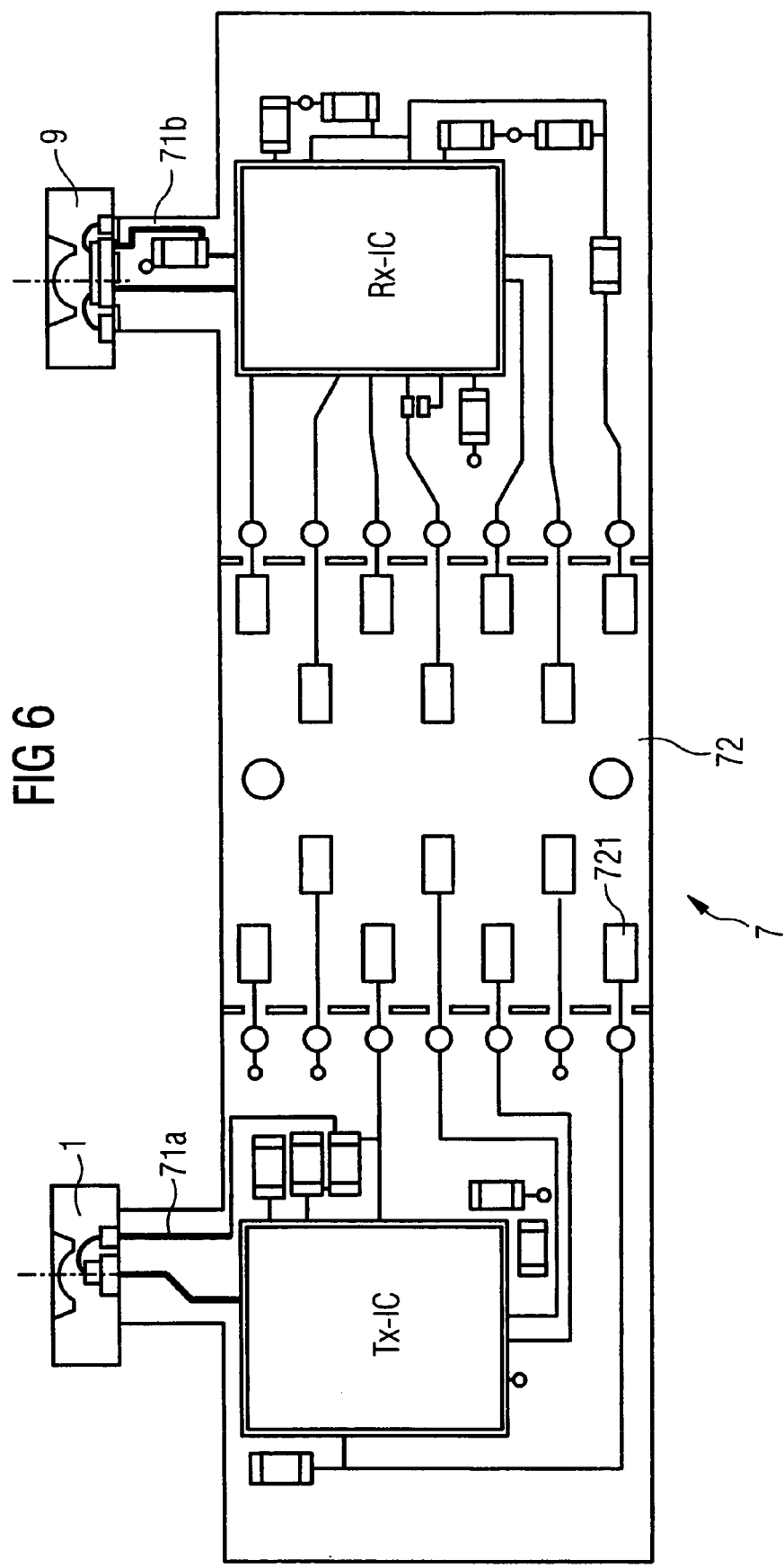
FIG. 6 is a circuit diagram a second embodiment of a circuit carrier, the circuit carrier being formed as a flex board and the tongue-shaped regions connected to a transmitting device or a receiving device being angled away by 90 degrees with respect to the plane of the figure in the connecting region.

FIG. 6 shows a circuit carrier corresponding to the circuit carrier represented in FIG. 3. The only differences are concerned with the fact that the circuit board 7 is completely formed as a flexible foil. The transducer devices 1, 9 represented are in a TSLP configuration, with the result that the terminal contacts are configured parallel to the optical axis. The transducer devices 1, 9 are disposed at subregions of the respective tongue-shaped region 71a, 71b which are angled away perpendicularly with respect to the plane of the drawing. The transducer components 1, 9 accordingly do not need to form a flattened contact side and may completely fill the interior space of the cylindrical continuation of the module housing.

The contacts 721 of the central or bottom part 72 are formed as SMD contacts. As an alternative, the contacts may also be realized as plug-in contacts.

The signaling represented is in turn only to be understood as given by way of example.

Figure 7:
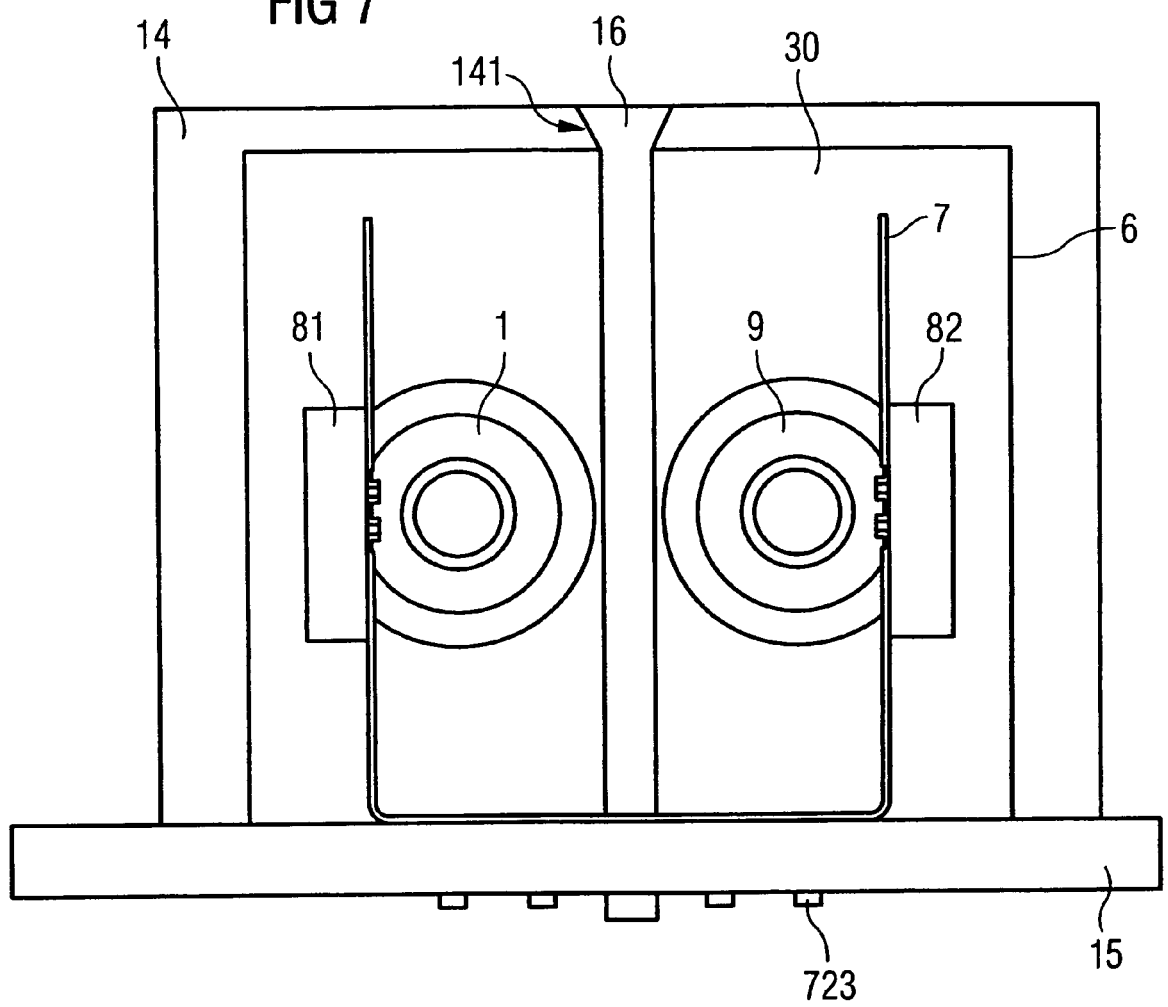
FIG. 7 is a front view showing a configuration of a module housing of an optoelectronic transceiver according to FIGS. 2 and 5A–5E in a surrounding housing and disposed on a main circuit board.
Figure 10:
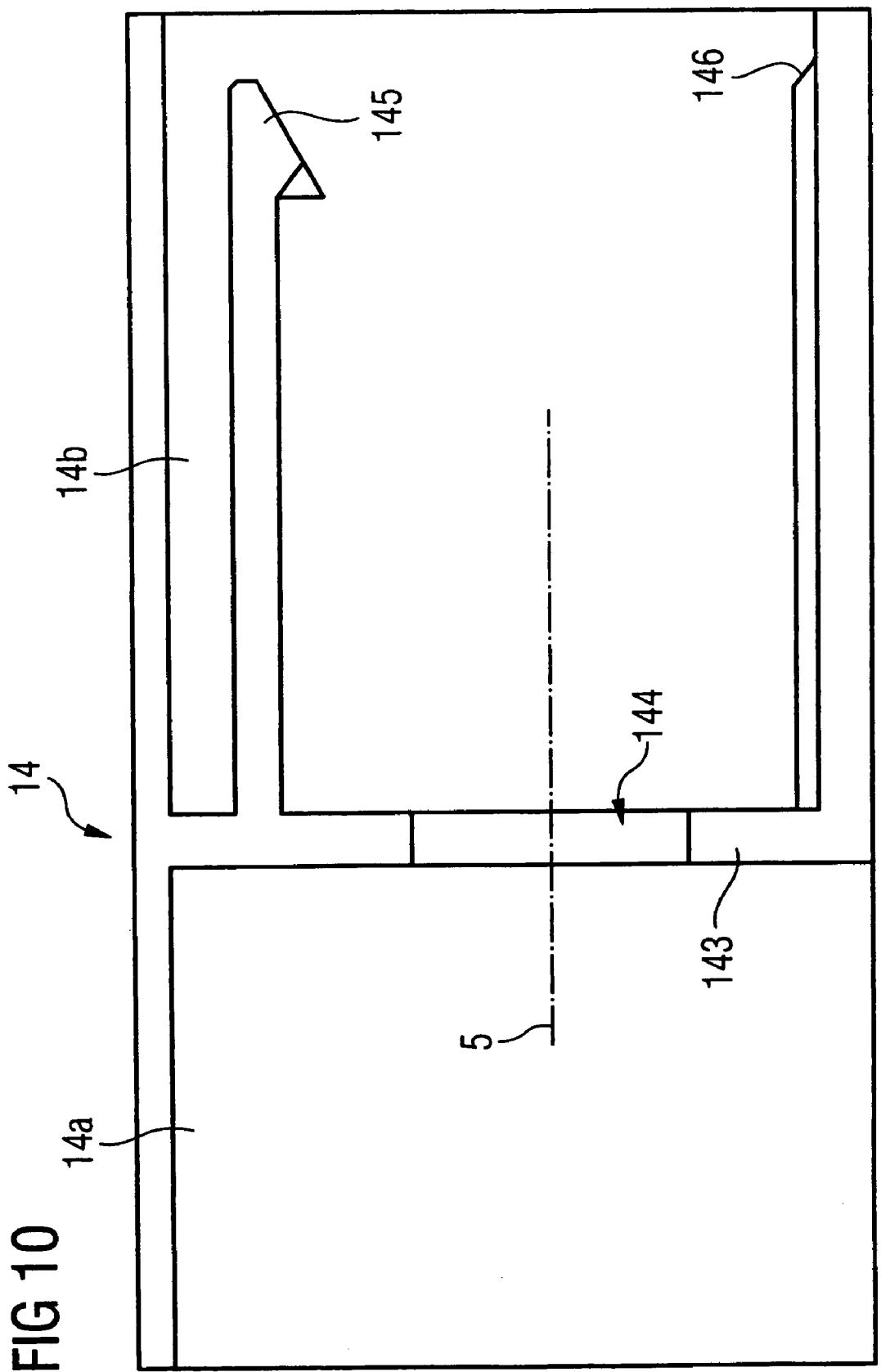
FIG. 10 is a sectional view through the surrounding housing of FIGS. 7 and 9 parallel to the longitudinal axis of the surrounding housing, the surrounding housing forming a first region and a second region.

FIG. 7 shows the optoelectronic module described in FIGS. 1 to 6, disposed in a surrounding housing (also known as a header) 14, which has a front plug receptacle, represented in FIG. 10. The sectional representation illustrated runs perpendicularly with respect to the optical axes of the transmitting and receiving device. It reveals well the circuit carrier 7, represented in FIGS. 3 and 6 and now bent in a U-shaped manner, the bottom region 72 of which is connected to a main circuit board 15. The U-shaped installation of the circuit carrier 7 makes it possible to configure the electrical contacts by using lithography. In the exemplary embodiment represented, the electrical terminals are configured as plug-in contacts 723.

Likewise revealed well in FIG. 7 are the two wiring devices 81, 82, which are disposed on the circuit board. The transducer devices 1, 9 are represented in a front view. The transmitting device or receiving device lies behind the plane of the drawing and cannot be seen. In the case of the configuration of FIG. 7, the transducer devices 1, 9 are formed in a way corresponding to the configuration of FIG. 1, i.e. with a flattening toward the contact side, which can likewise be seen.

Also provided is a metallic pin 16, which is mounted in a corresponding opening 141 of the surrounding housing 14 and passes through the module housing 6 and the main circuit board 15 and fixes these elements firmly to each other. Due to the metallic form of the pin 16, it additionally serves the purpose of leading away currents induced in the interior of the module housing 6. In this connection, it is pointed out that the interior of the module housing 6 is filled with an electrically conductive encapsulating material 30, in order to provide additional electromagnetic shielding of the optoelectronic module.

Figure 8:
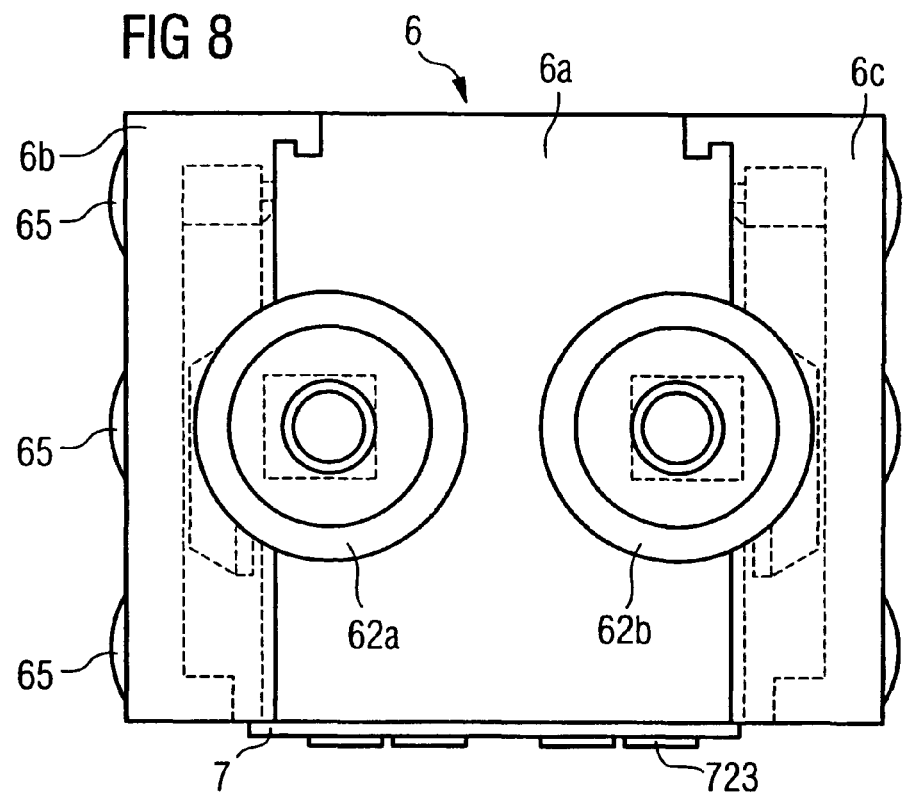
FIG. 8 is a front view showing the module housing of FIG. 7 after attaching additional side covers and without showing the surrounding housing.

FIG. 8 shows the module housing of FIG. 7, but without the surrounding housing 14 and without the printed circuit board 15. The terminal contacts 723 of the lower region of the module housing 7 are in this case formed as SMD contacts.

Furthermore, the module housing 6 has been completely assembled in the representation of FIG. 6. It includes a central part 6a and two side parts 6b, 6c, which are fastened with the electrical devices on the central part 6a in accordance with the configuration of the circuit board. An exemplary form of hooking between the side parts 6b, 6c and the central part 6a is depicted in FIG. 8. The opposing force, which stabilizes the hooking, is provided by the circuit board bent in a U-shaped manner, which is hooked into both side parts 6b, 6c.

The outer sides of the side parts 6b, 6c are provided with small beads 65, which ensure playfree clamping of the module housing 6 in the surrounding housing 14 represented in FIG. 7.

Figure 9:
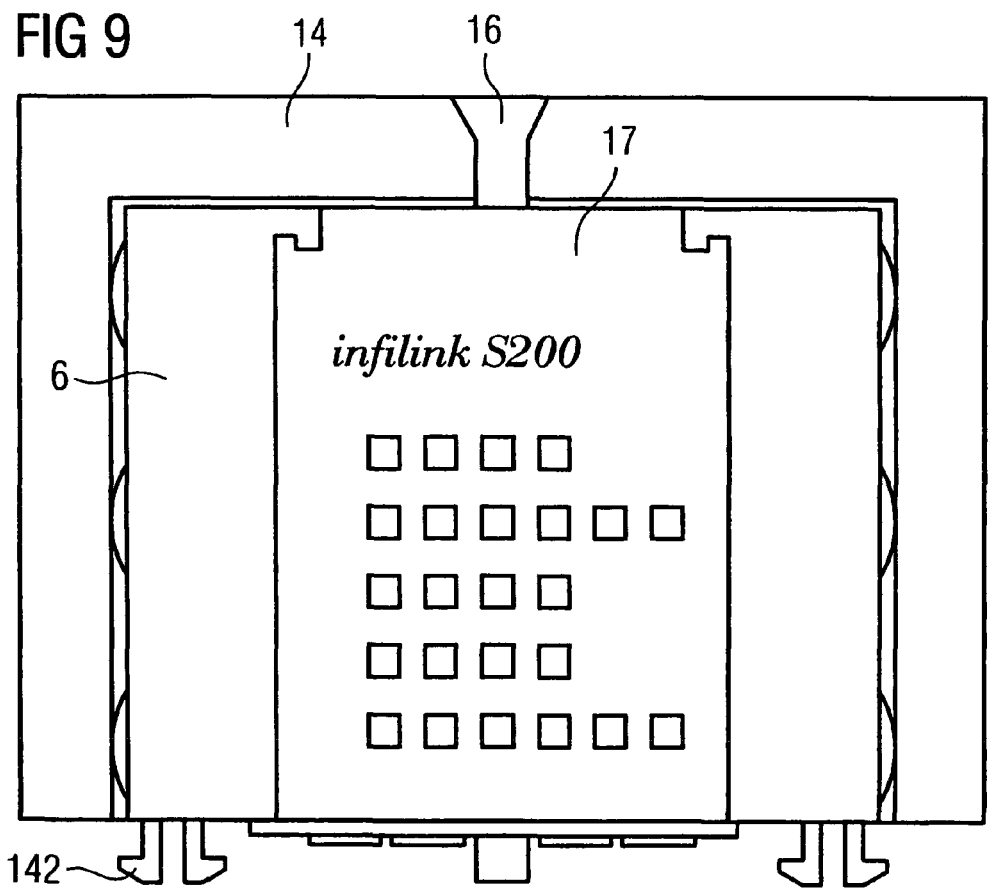
FIG. 9 is a rear view showing the module housing of FIGS. 7 and 8 after mechanical fixing in the surrounding housing.

FIG. 9 shows, in a rear view, the finished electrooptical module, installed completely in the surrounding housing 14, with a conducting pin 16 for the mechanical fixing and clamping elements 142 of the surrounding housing for the arresting of the surrounding housing 14 on a main circuit board of the appliance. The CAI module housing 6 is closed by the side parts and accommodates the circuit carrier, bent in a U-shaped manner, with the wiring devices, the transmitting device and the receiving device. An inscription 17 serves for identification and for tracing the production operation.

FIG. 10 shows a sectional view of the surrounding housing 14 of FIGS. 7 and 9. The surrounding housing 14 has a first region 14a, which serves for receiving the module housing 6 according to FIGS. 7 to 9. A second region 14b, offset axially with respect to the first region, provides a receiving opening for an optical plug to be coupled on. The two regions are separated from each other by a dividing wall 143. The dividing wall has in this case an opening 144, which is aligned in a centered manner with respect to the optical axis 5 and through which the continuation 62 of the module housing 6 fitted into the region 14a is inserted, so that the continuation is located with the transducer device, disposed in the continuation, in the region 14b. Also provided in the region 14b is a spring catch 145 for latching engagement with an optical plug and a guiding web 146 for such a plug.

Figure 11:
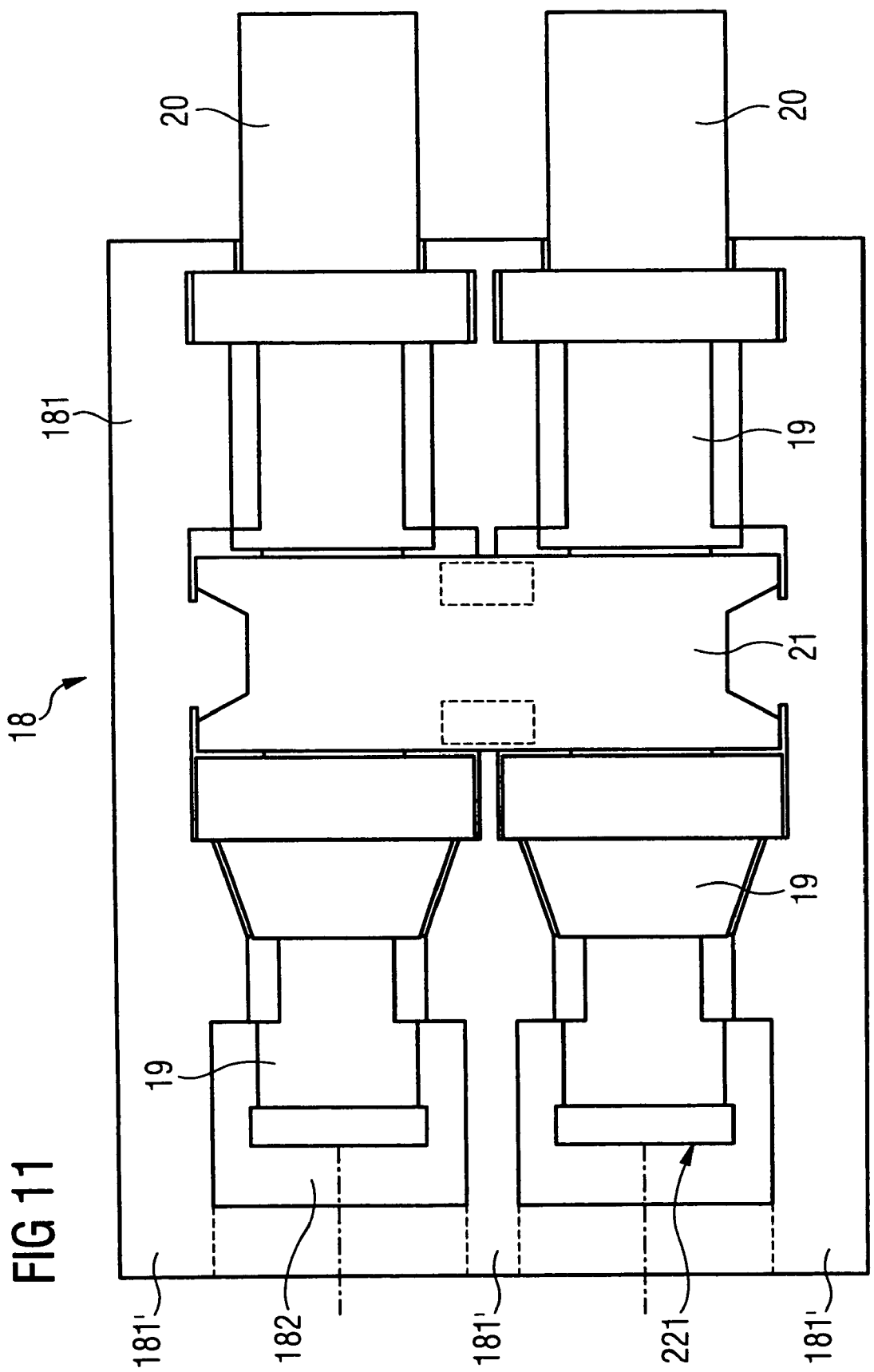
FIG. 11 is a bottom view showing an optical plug with two optical fibers, the end faces of which are set back from the front side of the plug.

FIG. 11 shows, in a view from below, an optical plug that can be coupled with the optoelectronic module of FIGS. 1 to 10 and for this purpose can be inserted into the surrounding housing 14 of FIG. 10. Two fiber ferrules 19, which receive an optical fiber of a POF cable 20 in each case, have been pressed into a plug housing 181. The fiber ferrules 19 are optionally fixed in the plug housing 181 by a metal clamp 21.

The fiber ferrules 19 with the POF fibers end in the front region of the plug housing 181 in each case in an opening 182 in the plug housing 181, into which the continuation 62a, 62b of the module housing 6 of the optoelectronic transceiver enters during the coupling operation.

It is pointed out that the plug housing 181 forms at the extreme end a fixed, peripheral guard wall 181', which projects in a protective manner beyond the end face 221 of the ferrules 19 and/or the POF fibers contained in them and consequently meets the already mentioned kojiri criterion. Due to the fixed guard wall 181', the end faces 221 of the POF fibers are reliably protected from soiling and damage, in particular caused by incorrect plugging or blind plugging.

Figure 12:
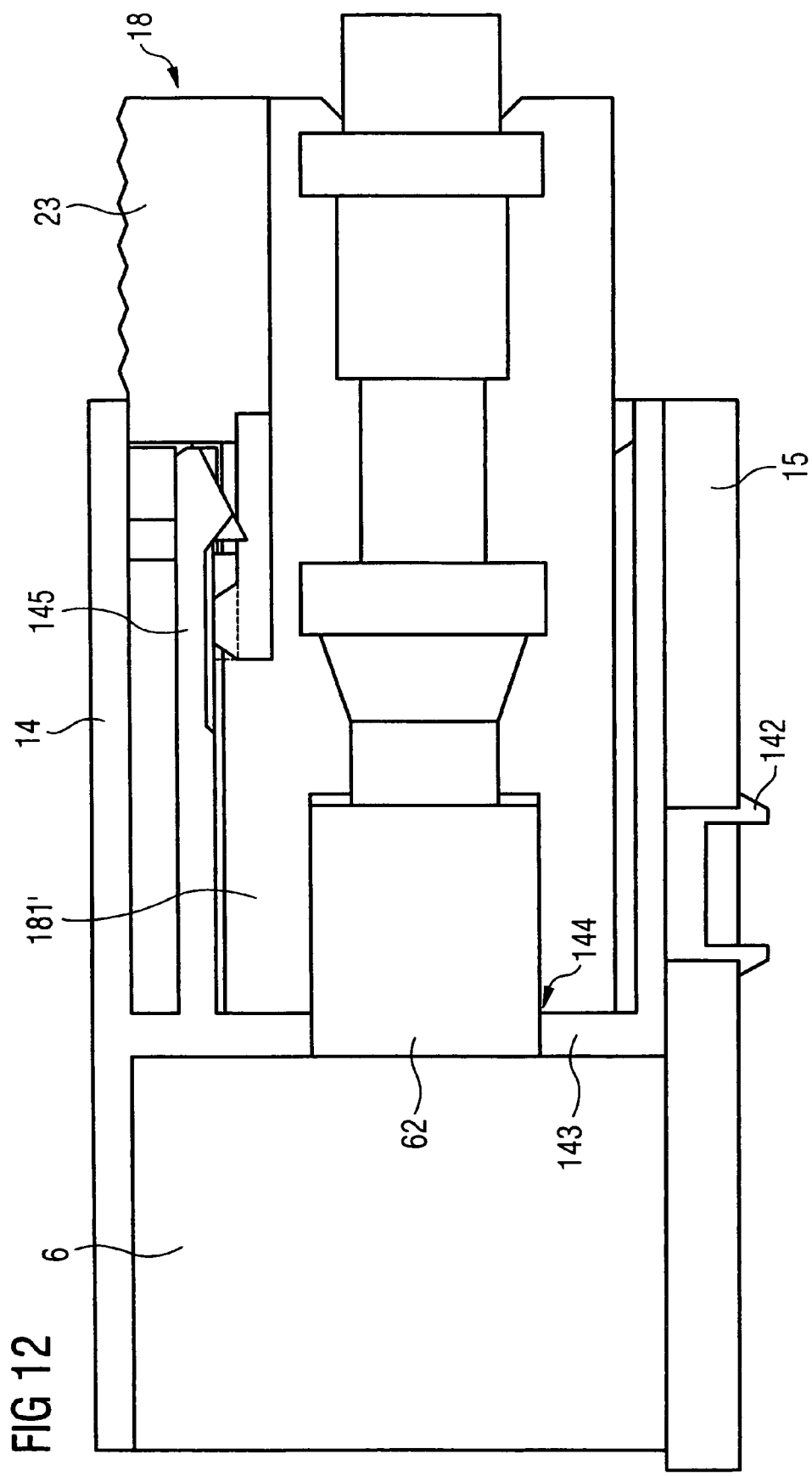
FIG. 12 is a lateral sectional view showing the transceiver represented in FIGS. 1 to 10 with an inserted plug according to FIG. 11.

FIG. 12 shows the plug 18 of FIG. 11, inserted into the surrounding housing 14 of FIG. 10, the module housing 6 having been fitted with the cylindrical continuation 61 into the surrounding housing 14. The cylindrical continuation 62 protrudes in the way mentioned with respect to FIG. 10 through the opening 144 of the dividing wall 143 of the surrounding housing 14. Furthermore, the cylindrical continuation 62 protrudes into the openings 182 of the plug housing 181, the fiber end face 221 of the POF fibers 20 respectively coming to bear against the fiber stop face 42 (see FIG. 1) of the transducer device. The peripheral guard wall 181' of the plug housing in this case extends beyond the transmitting or receiving devices disposed in the cylindrical continuation 62 and encloses around them to a certain extent. The spring catch 145 of the surrounding housing 14 has engaged in a latching opening of the optical plug 18, it being possible for unlocking to take place by using a displaceable plug release 23.

It can also be seen that the entire configuration is disposed on a main circuit board 5, and the surrounding housing 14 is firmly locked with the main circuit board 15 by using the arresting clamps 142 represented in FIG. 9.

FIG. 13 shows a plan view of the optical plug 18 in the locking region. The spring catch 145 has engaged by using a latching edge 25 on the optical plug 18. Lateral clamping lobes 24, which engage in lateral recesses 145a of the spring catch 145, prevent the spring catch from being able to spring out upward.

FIG. 14 shows the optical plug in a view from above without the plug release 23 of FIG. 18 and without the spring catch 145. Provided in the right-hand region are two spherical elevations 26, which engage in clearances formed on the underside of the plug release and thereby keep the plug release in a forward position. A kind of spring which allows the elevations 26 to be easily pressed downward when the plug release 23 is pulled back is provided by two elongate clearances 27 respectively provided laterally with respect to the elevations 26, with the result that the pulling back of the plug release is made easier.

It is also represented that the lateral clamping lobes 24 form on their underside oblique edges for the opening of the clamping lobes in interaction with the plug release 23. An opening 28 in the plug serves for receiving the latching lug of the spring catch 145. The two optical axes 5', 5" respectively of the transmitting device and of the receiving device are likewise depicted.

A triangular elevation 29 serves for the arresting of the plug release 23 and prevents the latter from coming free when the plug is pulled out.

FIG. 15 finally shows the plug release 23. The latter has on its upper side ridges 231, which facilitate pushing back of the plug release. Formed on the underside are clearances 234, which, as explained, serve for the fixing and movement by using the half-spheres or elevations 26 according to FIG. 14. A rear clearance 235 on the underside of the plug release 23 provides a rearward stop, which prevents the plug release from being pulled out from the optical plug 18.

The front region of the plug release forms two lateral arms 232, 233. The arms respectively have on the one hand an elevation 232a, 233a with an obliquely running edge 232a', 233' and on the other hand a trapezoidal elevation 232b, 233b. These elevations interact with the clamping lobes 24 in such a way that, when the plug release 23 is pulled back, first of all the oblique edges 232a', 233a' of the elevations 232a, 233a act on the oblique edges on the underside of the clamping lobes 24, the clamping lobes as a result spring outward and consequently release the spring catch 145. Subsequently, the spring catch 145 is raised by the trapezoidal elevations 232b, 233b, with the result that unlocking takes place.

We claim:

1. An optoelectronic transmitting module, comprising:
   a transmitting device having an optical axis;
   an electrical wiring device connected to said transmitting device;
   a circuit carrier connected to said transmitting device, supporting said transmitting device and said electrical wiring device, said circuit carrier having a portion forming a tongue-shaped region; and
   a module housing holding said circuit carrier at least partially parallel to said optical axis and having a continuation extending in a direction of said optical axis of said transmitting device, said continuation being configured to couple to an optical plug and having said tongue-shaped region extending therein, said transmitting device being disposed within said continuation and said transmitting device being electrically connected with said tongue-shaped region.

2. The module according to claim 1, wherein said module housing forms said continuation.

3. The module according to claim 1, wherein said module housing is originally separately formed from said continuation and is connected to said continuation.

4. The module according to claim 1, wherein said continuation is cylindrically formed.

5. The module according to claim 1, further comprising a device housing made of a transparent encapsulating material and holding said transmitting device.

6. The module according to claim 5, further comprising a leadframe supporting said transmitting device, cast into said device housing, and having terminal contacts protruding laterally from said device housing.

7. The module according to claim 5, wherein:
   said device housing has a rear side; and
   said transmitting device forms electrical terminal contacts on said rear side of said device housing.

8. The module according to claim 1, wherein said circuit carrier is formed from a solid, non-flexible material.

9. The module according to claim 1, further comprising:
   a receiving device having an optical axis and extending in said continuation; and
   a further wiring device connected to said receiving device and mounted on said circuit carrier;
   said circuit carrier forming a further tongue-shaped region extending in said continuation;
   said module housing extending in a direction of said axis of said receiving device.

10. The module according to claim 9, further comprising a device housing made of a transparent encapsulating material and holding said receiving device.

11. The module according to claim 10, further comprising a leadframe supporting said receiving device, cast into said device housing, and having terminal contacts of said leadframe protruding laterally from said device housing.

12. The module according to claim 10, wherein:
   said device housing has a rear side; and
   said receiving device forms electrical terminal contacts on a rear side of said device housing.

13. The module according claim 1, wherein said circuit carrier is formed as a flexible circuit carrier.

14. The module according to claim 13, wherein said flexible circuit carrier is a flexible board.

15. The module according to claim 6, wherein said device housing is flattened to a side with the terminal contacts toward said circuit carrier.

16. The module according to claim 8, wherein said device housing is flattened to a side with terminal contacts toward said circuit carrier.

17. The module according to claim 7, wherein said device housing has rearwardly disposed terminal contacts bonded to said circuit carrier, said tongue-shaped region of said circuit carrier having an end angled away by 90°.

18. The module according to claim 15, wherein said device housing has rearwardly disposed terminal contacts bonded to said circuit carrier, said tongue-shaped region of said circuit carrier having an end angled away by 90°.

19. The module according to claim 16, wherein said device housing has rearwardly disposed terminal contacts bonded to said circuit carrier, said tongue-shaped region of said circuit carrier having an end angled away by 90°.

20. The module according to claim 1, wherein said module housing is open on at least one side.

21. The module according to claim 1, wherein said module housing is formed of an electrically conducting material.

22. The module according to claim 1, wherein said module housing is filled with an electrically conductive encapsulating material.

23. The module according to claim 10, further comprising a side part closing said module housing.

24. The module according to claim 11, further comprising a side part closing said module housing.

25. The module according to claim 12, further comprising a side part closing said module housing.

26. The module according to claim 5, wherein said device housing is formed with a circular section.

27. The module according to claim 5, wherein said device housing is formed with a rectangular section.

28. The module according to claim 5, wherein said continuation of said module housing and said device housing and said transmitting device form structures permitting self-adjusting mounting in said continuation.

29. The module according to claim 9, wherein said continuation of said module housing and said device housing, said transmitting device, and said receiving device form structures permitting self-adjusting mounting in said continuation.

30. The module according to claim 5, further comprising an elastic deforming body disposed in said continuation of said module housing and resiliently mounting said device housing in said continuation.

31. The module according to claim 1, further comprising a surrounding housing having a first region and a second axially offset region, said first region receiving said module housing and said second region having a receiving opening formed therein for an optical plug to be coupled thereon.

32. The module according to claim 31, wherein said second region of said surrounding housing has a snap mechanism for latchingly connecting to an optical plug.

33. The module according to claim 31, further comprising a dividing wall separating said first region and said second region of said surrounding housing and forming an opening formed therein, said continuation of said module housing protruding in said second region.

34. The module according to claim 31, further comprising a fixing pin mounted in said surrounding housing and passing through said module housing.

35. The module according to claim 34, wherein said fixing pin is electrically conducting.

36. The module according to claim 9, wherein said module housing has a further continuation spaced apart from said continuation, said continuations each holding one of said transmitting device and said receiving device.

37. The module as claimed in claim 36, wherein said circuit carrier is U-shaped and thereby has:
    a bottom region with terminal contacts for electrically bonding said circuit carrier to a main circuit board,
    a first side region angled away by 90° with respect to said bottom region and bearing said transmitting device and said wiring device, and
    a second region angled away by 90° with respect to said bottom region and bearing said receiving device and said further wiring device.

38. The module according to claim 36, wherein said module housing has a central housing and two side parts laterally closing said central housing.

39. The module according to claim 1, wherein said continuation is configured to couple to an optical plug having an extreme end and a fixed peripheral guard wall formed at the extreme end, the peripheral guard wall extending laterally over said continuation and said transmitting device during a coupling of the optical plug to said continuation.

40. An optoelectronic receiving module, comprising:
    a receiving device having an optical axis;
    an electrical wiring device connected to said receiving device;
    a circuit carrier connected to said receiving device, supporting said receiving device and said electrical wiring device, said circuit carrier having a portion forming a tongue-shaped region; and
    a module housing holding said circuit carrier at least partially parallel to said optical axis and having a continuation extending in a direction of said optical axis of said receiving device, said continuation being configured to couple to an optical plug and having said tongue-shaped region extending therein, said receiving device being disposed within said continuation and said receiving device being electrically connected with said tongue-shaped region.

41. The module according to claim 40, wherein said module housing forms said continuation.

42. The module according to claim 40, wherein said module housing is originally separately formed from said continuation and is connected to said continuation.

43. The module according to claim 40, wherein said continuation is cylindrically formed.

44. The module according to claim 40, further comprising a device housing made of a transparent encapsulating material and holding said receiving device.

45. The module according to claim 44, further comprising a leadframe supporting said receiving device, cast into said device housing, and having terminal contacts protruding laterally from said device housing.

46. The module according to claim 44, wherein:
    said device housing has a rear side; and
    said receiving device forms electrical terminal contacts on said rear side of said device housing.

47. The module according to claim 40, wherein said circuit carrier is formed from a solid, non-flexible material.

48. The module according to claim 45, wherein said device housing is flattened to a side with said terminal contacts toward said circuit carrier.

49. The module according to claim 47, wherein said device housing is flattened to a side with terminal contacts toward said circuit carrier.

50. The module according to claim 46, wherein said device housing has rearwardly disposed terminal contacts bonded to said circuit carrier, said tongue-shaped region of said circuit carrier having an end angled away by 90°.

51. The module according to claim 49, wherein said device housing has rearwardly disposed terminal contacts bonded to said circuit carrier, said tongue-shaped region of said circuit carrier having an end angled away by 90°.

52. The module according to claim 49, wherein said device housing has rearwardly disposed terminal contacts bonded to said circuit carrier, said tongue-shaped region of said circuit carrier having an end angled away by 90°.

53. The module according to claim 40, wherein said module housing is formed of an electrically conducting material.

54. The module according to claim 40, wherein said module housing is filled with an electrically conductive encapsulating material.

55. The module according to claim 44, wherein said device housing is formed with a circular section.

56. The module according to claim 44, wherein said device housing is formed with a rectangular section.

57. The module according to claim 44, wherein said continuation of said module housing and said device housing and said receiving device form structures permitting self-adjusting mounting in said continuation.

58. The module according to claim 44, further comprising an elastic deforming body disposed in said continuation of said module housing and resiliently mounting said device housing in said continuation.

59. The module according to claim 40, further comprising a surrounding housing having a first region and a second axially offset region, said first region receiving said module housing and said second region having a receiving opening formed therein for an optical plug to be coupled thereon.

60. The module according to claim 59, wherein said second region of said surrounding housing has a snap mechanism for latchingly connecting to an optical plug.

61. The module according to claim 59, further comprising a dividing wall separating said first region and said second region of said surrounding housing and forming an opening formed therein, said continuation of said module housing protruding in said second region.

62. The module according to claim 59, further comprising a fixing pin mounted in said surrounding housing and passing through said module housing.

63. The module according to claim 62, wherein said fixing pin is electrically conducting.

64. The module according to claim 40, wherein said continuation is configured to couple to an optical plug having an extreme end and a fixed peripheral guard wall formed at the extreme end, the peripheral guard wall extending laterally over said continuation and said receiving device during a coupling of the optical plug to said continuation.

* * * * *